United States Patent
Bae et al.

(10) Patent No.: US 11,967,529 B2
(45) Date of Patent: Apr. 23, 2024

(54) METHODS OF MANUFACTURING SEMICONDUCTOR CHIP

(71) Applicant: Samsung Electronics Co., Ltd., Suwon-si (KR)

(72) Inventors: Byung-moon Bae, Daegu (KR); Yoon-sung Kim, Seoul (KR); Yun-hee Kim, Cheonan-si (KR); Hyun-su Sim, Cheonan-si (KR); Jun-ho Yoon, Seoul (KR); Jung-ho Choi, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 704 days.

(21) Appl. No.: 17/093,991

(22) Filed: Nov. 10, 2020

(65) Prior Publication Data

US 2021/0057278 A1 Feb. 25, 2021

Related U.S. Application Data

(63) Continuation of application No. 16/359,440, filed on Mar. 20, 2019, now Pat. No. 10,854,517.

(30) Foreign Application Priority Data

Aug. 20, 2018 (KR) .................. 10-2018-0096824

(51) Int. Cl.
*H01L 23/544* (2006.01)
*H01L 21/768* (2006.01)
(Continued)

(52) U.S. Cl.
CPC .... *H01L 21/7806* (2013.01); *H01L 23/53295* (2013.01); *H01L 23/562* (2013.01)

(58) Field of Classification Search
CPC ... H01L 23/585; H01L 2924/00; H01L 21/78; H01L 23/562
See application file for complete search history.

(56) References Cited

U.S. PATENT DOCUMENTS 7,498,660 B2  3/2009 Kumagai
7,579,696 B2  8/2009 Ito et al.
(Continued)

FOREIGN PATENT DOCUMENTS

JP  2008066716 A  3/2008
JP  2008-270232 A  11/2008
(Continued)

*Primary Examiner* — Anthony Ho
*Assistant Examiner* — David J Goodwin
(74) *Attorney, Agent, or Firm* — Myers Bigel, P.A.

(57) ABSTRACT

Methods of manufacturing a semiconductor chip are provided. The methods may include providing a semiconductor substrate including integrated circuit regions and a cut region. The cut region may be between the integrated circuit regions. The methods may also include forming a modified layer by emitting a laser beam into the semiconductor substrate along the cut region, polishing an inactive surface of the semiconductor substrate to propagate a crack from the modified layer, and separating the integrated circuit regions along the crack. The cut region may include a plurality of multilayer metal patterns on an active surface of the semiconductor substrate, which is opposite to the inactive surface of the semiconductor substrate. The plurality of multilayer metal patterns may form a pyramid structure when viewed in cross section.

20 Claims, 21 Drawing Sheets

(51) Int. Cl.
*H01L 21/78* (2006.01)
*H01L 23/00* (2006.01)
*H01L 23/532* (2006.01)

(56) References Cited

U.S. PATENT DOCUMENTS

| | | | |
|---|---|---|---|
| 8,124,448 B2* | 2/2012 | Hudson | H01L 23/562 |
| | | | 438/106 |
| 8,354,735 B2 | 1/2013 | Lee et al. | |
| 8,368,180 B2* | 2/2013 | Yu | H01L 21/78 |
| | | | 257/E23.179 |
| 8,952,497 B2 | 2/2015 | Chen et al. | |
| 9,105,706 B2 | 8/2015 | Otsuka | |
| 9,406,625 B2 | 8/2016 | Wang et al. | |
| 9,786,490 B2 | 10/2017 | Harada | |
| 2002/0024115 A1 | 2/2002 | Ibnabdeljalil et al. | |
| 2006/0163699 A1 | 7/2006 | Kumakawa et al. | |
| 2008/0036042 A1 | 2/2008 | Sano et al. | |
| 2009/0039470 A1* | 2/2009 | Vo | H01L 23/585 |
| | | | 257/E23.179 |
| 2009/0108410 A1* | 4/2009 | Takemura | H01L 23/585 |
| | | | 257/E23.179 |
| 2009/0121313 A1 | 5/2009 | Hashimoto | |
| 2010/0203701 A1 | 8/2010 | Kim et al. | |
| 2011/0156219 A1 | 6/2011 | Kawashima et al. | |
| 2012/0080673 A1 | 4/2012 | Winter | |
| 2013/0256826 A1 | 10/2013 | Gambino et al. | |
| 2013/0280889 A1* | 10/2013 | Otsuka | H01L 21/76801 |
| | | | 438/462 |
| 2017/0047221 A1 | 2/2017 | Harada | |
| 2017/0345772 A1 | 11/2017 | Jackson et al. | |
| 2018/0053729 A1 | 2/2018 | Hsiao et al. | |

FOREIGN PATENT DOCUMENTS

| | | |
|---|---|---|
| JP | 2009123734 A | 6/2009 |
| JP | 2011-023516 A | 2/2011 |
| JP | 2011-134893 A | 7/2011 |
| JP | 2011-166183 A | 8/2011 |
| JP | 2012-160547 A | 8/2012 |
| JP | 2013-012788 A | 1/2013 |
| KR | 100879978 B1 | 1/2009 |
| KR | 10-2014-0035783 A | 3/2014 |
| KR | 101581431 B1 | 12/2015 |
| KR | 10-2017-0020242 A | 2/2017 |

* cited by examiner

METHODS OF MANUFACTURING SEMICONDUCTOR CHIP

CROSS-REFERENCE TO RELATED APPLICATION

This U.S. non-provisional patent application is a continuation of U.S. patent application Ser. No. 16/359,440, filed Mar. 20, 2020, now allowed, which claims priority under 35 U.S.C. § 119 to Korean Patent Application No. 10-2018-0096824, filed on Aug. 20, 2018, in the Korean Intellectual Property Office, the disclosure of which is incorporated herein in its entirety by reference.

BACKGROUND

The inventive concept generally relates to a method of manufacturing a semiconductor chip, and more particularly, to a method of manufacturing a semiconductor chip by cutting a semiconductor substrate by laser.

After integrated circuits are formed on an active surface of a semiconductor substrate, an inactive surface of the semiconductor substrate may be polished, and the polished semiconductor substrate may be cut to divide the integrated circuits into individual semiconductor chips. The polished semiconductor substrate may be mechanically cut by a sawing blade. When the semiconductor substrate is mechanically cut as described above, cut surfaces of the semiconductor chips may fracture, thereby causing many defects in the semiconductor chips. Accordingly, research has been conducted into a method of manufacturing a semiconductor chip by cutting a semiconductor substrate by laser.

SUMMARY

Embodiments according to the inventive concept provide a semiconductor chip manufacturing method capable of reducing or possibly suppressing errors in a process of cutting a semiconductor substrate into semiconductor chips by laser.

Aspects of the inventive concept are not limited to the descriptions provided herein, and other aspects not mentioned herein will be clearly understood by those of ordinary skill in the art from the following description.

According to some embodiments of the inventive concept, methods of manufacturing a semiconductor chip may include providing a semiconductor substrate including integrated circuit regions and a cut region. The cut region may be between the integrated circuit regions. The methods may also include forming a modified layer by emitting a laser beam into the semiconductor substrate along the cut region, polishing an inactive surface of the semiconductor substrate to propagate a crack from the modified layer, and separating the integrated circuit regions along the crack. The cut region may include a plurality of multilayer metal patterns on an active surface of the semiconductor substrate, which is opposite to the inactive surface of the semiconductor substrate. The plurality of multilayer metal patterns may form a pyramid structure when viewed in cross section.

According to some embodiments of the inventive concept, methods of manufacturing a semiconductor chip may include providing a semiconductor substrate including integrated circuit regions and a cut region. The cut region may be between the integrated circuit regions. The methods may also include forming a modified layer by emitting a laser beam into the semiconductor substrate along the cut region, polishing an inactive surface of the semiconductor substrate to propagate a crack from the modified layer, and separating the integrated circuit regions along the crack. The cut region may include a plurality of multilayer metal patterns on an active surface of the semiconductor substrate, which is opposite to the inactive surface, and an upper metal layer that is between the plurality of multilayer metal patterns and the active surface of the semiconductor substrate. Each of the plurality of multilayer metal patterns may be at a respective one of a plurality of levels, and a number of multilayer metal patterns of the plurality of multilayer metal patterns at a level of the plurality of levels may decrease as a distance between the level of the plurality of levels and the active surface increases. When viewed in cross section taken along a first direction, the plurality of multilayer metal patterns may be arranged to be symmetric with respect to a center of the plurality of multilayer metal patterns in the first direction.

According to some embodiments of the inventive concept, methods of manufacturing a semiconductor chip may include providing a semiconductor substrate including an active surface and an inactive surface opposite to the active surface. The semiconductor substrate may include integrated circuit regions and a cut region between the integrated circuit regions. The methods may also include forming a modified layer by positioning a light-converging point of a laser beam inside the semiconductor substrate and emitting the laser beam along the cut region, polishing the inactive surface of the semiconductor substrate to expose the modified layer, and separating the semiconductor substrate into semiconductor chips using the modified layer as a brittle fracture point. The cut region may include a plurality of metal patterns and a dielectric material film on sides of the plurality of metal patterns, and each of the plurality of metal patterns may be at a respective one of a plurality of levels. The plurality of levels may include a first level and a second level, the first level is between the second level and the active surface of the semiconductor substrate, a first number of metal patterns of the plurality of metal patterns are at the first level, a second number of metal patterns of the plurality of metal patterns are at the second level, and the second number may be less than the first number.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, embodiments of the inventive concept will be described in detail with reference to the accompanying drawings. As used herein the term "and/or" includes any and all combinations of one or more of the associated listed items.

Figure 1:
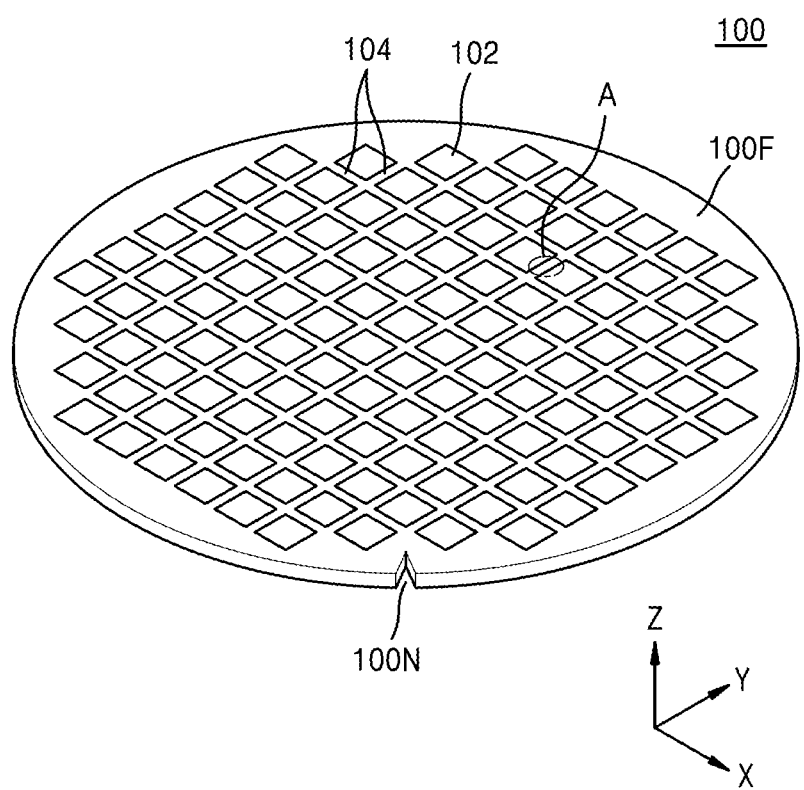
FIG. 1 is a perspective view of a semiconductor substrate according to some embodiments of the inventive concept.
Figure 2A:
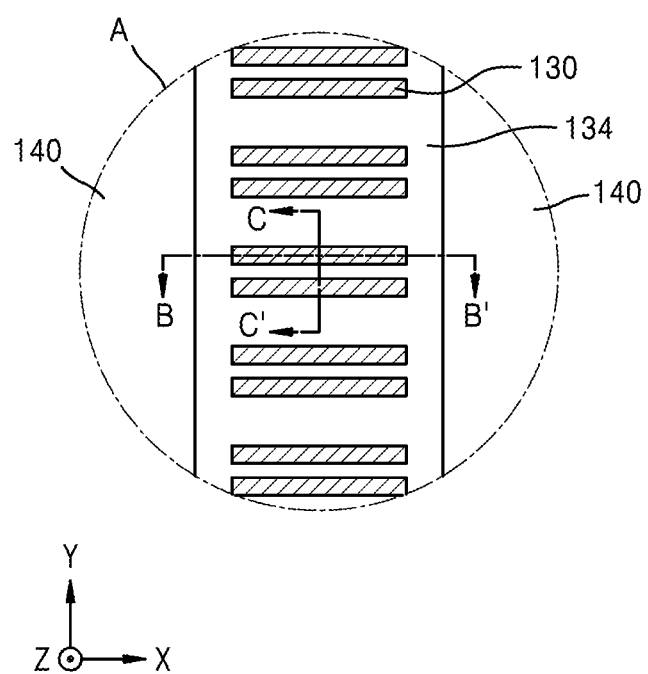
FIG. 2A is an enlarged plan view of the region A of FIG. 1.
Figure 2B:
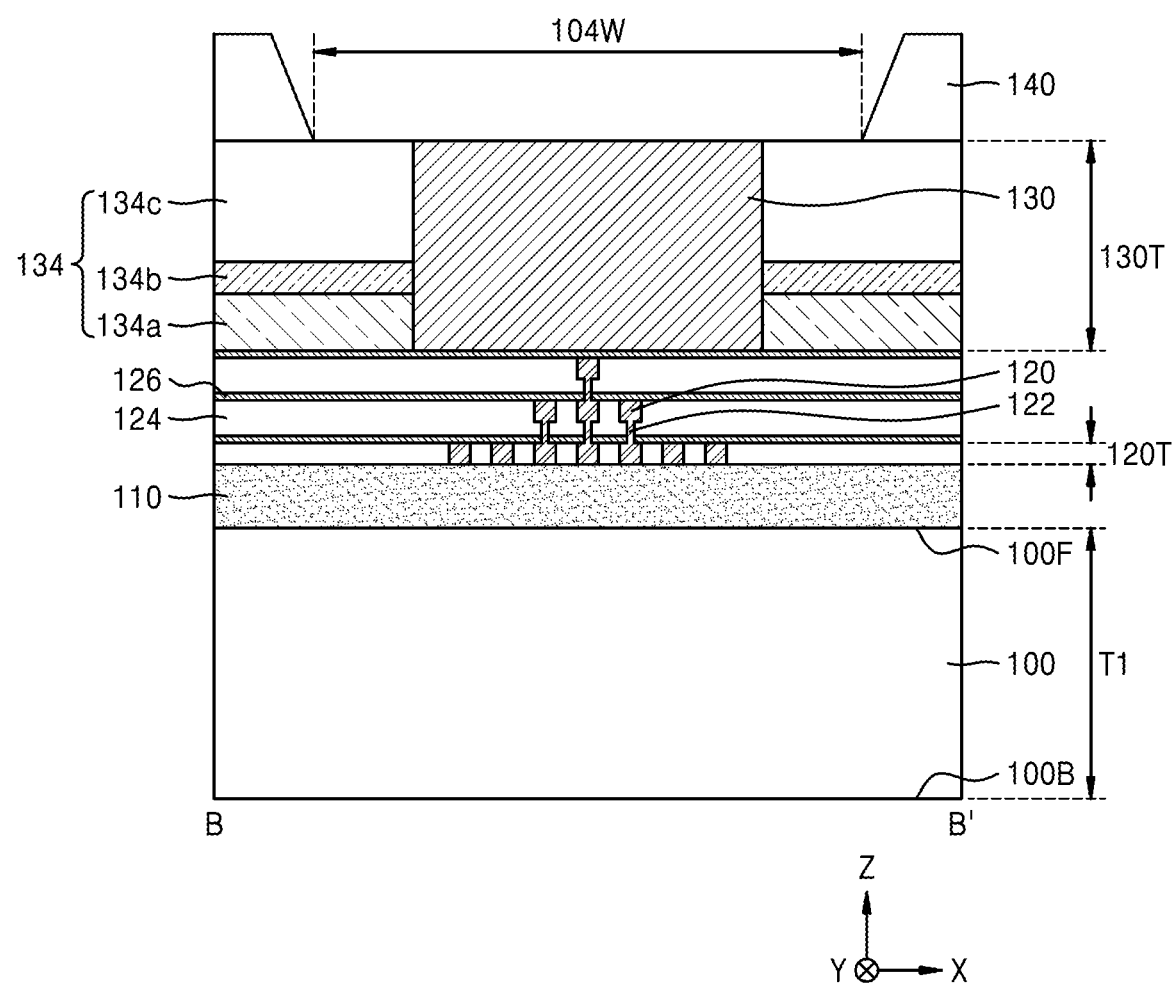
FIG. 2B is a cross-sectional view taken along the line B-B' of FIG. 2A.
Figure 2C:
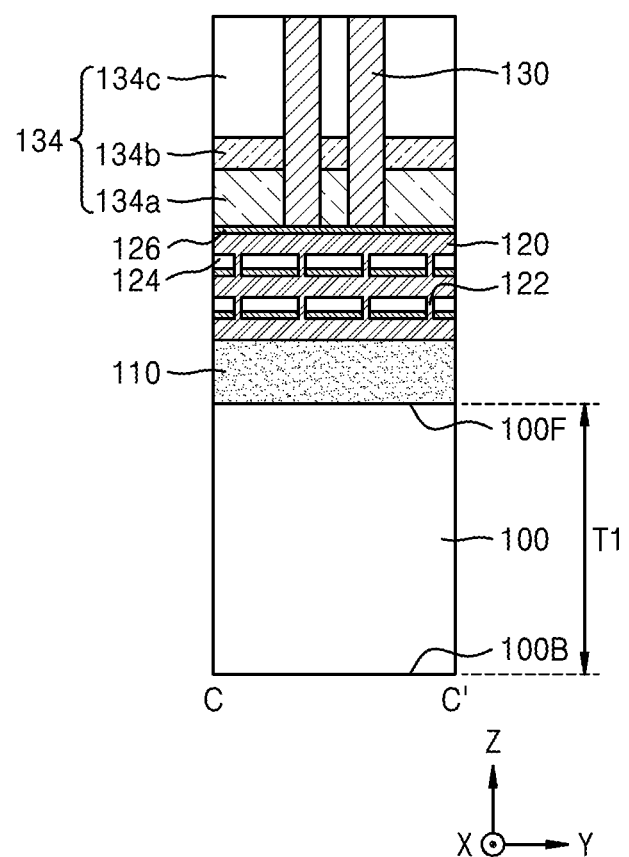
FIG. 2C is a cross-sectional view taken along the line C-C' of FIG. 2A.

FIG. 1 is a perspective view of a semiconductor substrate according to some embodiments of the inventive concept. FIG. 2A is an enlarged plan view of the region A of FIG. 1. FIG. 2B is a cross-sectional view taken along the line B-B' of FIG. 2A. FIG. 2C is a cross-sectional view taken along the line C-C' of FIG. 2A.

Referring to FIGS. 1 to 2C, a semiconductor substrate 100 including integrated circuit regions 102 and cut regions 104 is prepared.

The semiconductor substrate 100 may be a wafer and may have a round shape having a first thickness T1. The semiconductor substrate 100 may have a notch 100N as a reference point for wafer arrangement.

The semiconductor substrate 100 may include, for example, silicon. In some embodiments, the semiconductor substrate 100 may include a semiconductor element such as germanium or a compound semiconductor such as silicon carbide (SiC), gallium arsenide (GaAs), indium arsenide (InAs), or indium phosphide (InP). In some embodiments, the semiconductor substrate 100 may have a silicon-on-insulator (SOI) structure. In some embodiments, the semiconductor substrate 100 may include an impurity-doped well or an impurity-doped structure, which is a conductive region. Furthermore, the semiconductor substrate 100 may have various isolation structures such as a shallow trench isolation (STI) structure.

Here, it is assumed that the semiconductor substrate 100 has a diameter of about 12 inches, and a case in which a silicon wafer is used will be described below. However, it will be understood by those of ordinary skill in the art that the semiconductor substrate 100 may have a diameter which is less than or greater than about 12 inches or may be formed of a material other than silicon. The semiconductor substrate 100 may have the first thickness T1 of about 0.1 mm to about 1 mm. When the first thickness T1 of the semiconductor substrate 100 is extremely small, mechanical strength may be insufficient. When the first thickness T1 of the semiconductor substrate 100 is extremely large, it may take a large amount of time to perform grinding at a later time, thereby reducing the productivity of semiconductor chips.

The semiconductor substrate 100 may have an active surface 100F, which is a front side, and an inactive surface 100B, which is a back side. The integrated circuit regions 102 that are to be divided into semiconductor chips 10 (see FIG. 10) at a later time may be formed on the active surface 100F.

A semiconductor device may be divided broadly into a memory device and a logic device.

The memory device may be embodied as a volatile memory device or a nonvolatile memory device. The volatile memory device may include existing volatile memory devices, such as a dynamic random access memory (DRAM), a static RAM (SRAM), a thyristor RAM (TRAM), a zero capacitor RAM (ZRAM), and a twin transistor RAM (TTRAM), and volatile memory devices that are currently under development. The nonvolatile memory device may include existing nonvolatile memory devices, such as a flash memory, a magnetic RAM (MRAM), a spin-transfer torque MRAM (STT-MRAM,) a ferroelectric RAM (FRAM), a phase-change RAM (PRAM), a resistive RAM (RRAM), a nanotube RRAM, a polymer RAM, a nano floating gate memory, a holographic memory, a molecular electronics memory, and an insulator resistance change memory, and nonvolatile memory devices that are currently under development.

The logic device may be embodied as, but is not limited to, a microprocessor, a graphics processor, a signal processor, a network processor, an audio codec, a video codec, an application processor, or a system-on-chip. The microprocessor may include, for example, a single core or a multi-core.

The integrated circuit regions 102 may be arranged to be isolated or spaced apart from each other by the cut regions 104. In some embodiments, the cut region 104 may be provided between adjacent integrated circuit regions 102, as illustrated in FIG. 1. The cut regions 104 may be referred to as scribe lanes. The cut regions 104 may extend to cross each other in a first direction X and a second direction Y perpendicular to the first direction X. The cut regions 104 may be straight lanes having a constant width.

That is, the integrated circuit regions 102 may be surrounded by the cut regions 104 to be spaced apart from each other. As will be described below, the semiconductor substrate 100 and various types of material films on the semiconductor substrate 100 may be cut by a cutting process performed along the cut regions 104 to divide the integrated circuit regions 102 into the semiconductor chips 10 (see FIG. 10).

A semiconductor device layer 110 may be formed on the active surface 100F of the semiconductor substrate 100. The semiconductor device layer 110 includes a region including a plurality of semiconductor elements in the integrated circuit regions 102 and a region including a plurality of semiconductor dummy elements in the cut regions 104.

Multilayer metal patterns 120 may be formed from a top surface of the semiconductor device layer 110 to a bottom surface of an upper metal layer 130. Both sidewalk of the multilayer metal patterns 120 may be covered with an interlayer insulating film 124 and upper surfaces thereof may be covered with an interlayer material film 126. It will be understood that "an element A covers a surface of an element B" (or similar language) means that the element A is on the surface of the element B but does not necessarily mean that the element A covers the surface of the element B entirely.

The multilayer metal patterns 120 may be connected to each other via vertical vias 122 in a third direction Z perpendicular to the active surface 100F of the semiconductor substrate 100. The multilayer metal patterns 120 may be formed of at least one of, for example, aluminum (Al), copper (Cu), nickel (Ni), tungsten (W), and platinum (Pt). The vertical vias 122 may be formed of the same material as the multilayer metal patterns 120.

In some embodiments, the both sidewalls of each of the multilayer metal patterns 120 may be formed to be flat, as illustrated in FIG. 2B. The multilayer metal patterns 120 may be in the form of a bar formed of a single metal, having both flat sidewalls, and having a long axis and a short axis. Accordingly, the multilayer metal patterns 120 may not have an interface between different materials and protruding portions, thereby more effectively inducing the propagation of a crack CR in the third direction Z (see FIG. 9B), as described below.

The multilayer metal patterns 120 may be dummy structures formed in the cut regions 104. That is, the multilayer metal patterns 120 may be formed as dummy structures corresponding to a wiring in the integrated circuit regions 102, In some embodiments, the multilayer metal patterns 120 may be formed concurrently with a wiring in the integrated circuit regions 102. The multilayer metal patterns 120 may not be electrically connected to other conductive elements such that the multilayer metal patterns 120 may be considered as dummy, structures. It will be understood that "formed concurrently" refers to being formed in a same fabrication step, at approximately (but not necessarily exactly) the same time.

The multilayer metal patterns 120 are illustrated as each having three layers but are not limited thereto. For example, the multilayer metal patterns 120 may include two layers or four or more layers unlike that illustrated in the drawings.

In detail, the multilayer metal patterns 120 may be N-layer metal patterns (here, N is an integer greater than or equal to 2), and the number of K-layer metal patterns 120 per unit area among the multilayer metal patterns 120 may be less than that of (K−1)-layer metal patterns 120 per unit area (here, K is an integer from 2 to N).

That is, the multilayer metal patterns 120 may be formed to have a pyramid structure on the active surface 100E of the semiconductor substrate 100. In other words, the multilayer metal patterns 120 may be formed on the active surface 100F of the semiconductor substrate 100 such that the number thereof per unit area decreases in the third direction Z.

Referring to FIG. 2B, in some embodiments, the multilayer metal patterns 120 may be disposed at multiple levels (e.g., three levels) to form a pyramid structure, and a number of the multilayer metal patterns 120 at a single level may decrease as a distance between the active surface 100F and the level increases. For example, as illustrated in FIG. 2B, seven multilayer metal patterns 120 are at a first level that is the closest level to the active surface 100F, three multilayer metal patterns 120 are at a second level that is the second closest level to the active surface 100F, and a single multilayer metal pattern 120 is at a third level that is the farthest level from the active surface 100F. Although, FIG. 2B shows a specific number of the multilayer metal patterns 120 at a level, it will be understood that numbers of the multilayer metal patterns 120 at levels can vary. A group of the multiple layer metal patterns 120 at one level may be spaced apart from each other in the first direction X. In some embodiments, the multilayer metal patterns are arranged to be symmetric with respect to a center of the multilayer metal patterns in the first direction, as illustrated in FIG. 2B.

The upper metal layer 130 may be formed on the multilayer metal patterns 120. That is, the lower surface of the upper metal layer 130 may be at a higher level than an uppermost surface of the multilayer metal patterns 120. Both sidewalls of the upper metal layer 130 may be covered by an upper insulating film 134, and an upper surface thereof may be exposed by the upper insulating film 134.

The first direction X, which is a long-axis direction of the upper metal layer 130, and the second direction Y, which is a long-axis direction of the multilayer metal patterns 120, may be perpendicular to each other. Ac thickness 1301 of the upper metal layer 130 may be greater than a thickness 120T of each of the multilayer metal patterns 120.

The upper metal layer 130 may be available or may be used as a test pattern for testing electrical characteristics of the integrated circuit regions 102, an align key for mask alignment, or a redistribution layer for electrical connection of the integrated circuit regions 102.

In some embodiments, the interlayer insulating film 124 may include, for example, a low-k dielectric material, the interlayer material film 126 may include, for example, silicon carbonitride (SiCN), and the upper insulating film 134 may include, for example, silicon oxide and/or silicon nitride.

The low-k dielectric material included in the interlayer insulating film 124 is a material having a dielectric constant lower than that of silicon oxide. When the interlayer insulating film 124 includes the low-k dielectric material, the insulating capability of a semiconductor device may be enhanced and thus an integration degree and an operating speed thereof may be easily increased. However, the low-k dielectric material has a lower elastic modulus and lower hardness than those of other dielectric materials due to the porous film characteristics thereof and thus the mechanical properties thereof may deteriorate, thereby, causing peeling.

The upper insulating film 134 may have, for example, a structure in which a silicon oxide and a silicon nitride, such as phosphor silicate glass (PSG), boro-phosphor silicate glass (BPSG), undoped silicate glass (USG), tetraethyl orthosilicate (TEOS), plasma enhanced-TEOS (PE-TEOS), and a high-density plasma-chemical vapor deposition (HDP-CVD) oxide, are alternately stacked.

In some embodiments, the interlayer insulating film 124 may have a structure in which a first interlayer insulating film, a second interlayer insulating film, and a third interlayer insulating film are sequentially stacked with the interlayer material film 126 therebetween. However, the number of films constituting the interlayer insulating film 124 is not limited thereto. The interlayer insulating film 124 may be formed to fill the perimeter of the multilayer metal patterns 120 formed of a conductive material and the vertical vias 122.

A protective film 140 may be formed to expose the top of the cut regions 104 and cover the top of the integrated circuit regions 102. Sidewalls of the protective film 140 may be inclined planes. The protective film 140 may be, for example, a material film formed of an organic compound. In some embodiments, the protective film 140 may be a material film composed of an organic polymer material. In some embodiments, the protective film 140 may include photosensitive polyimide (PSPI) resin. A width 104 W of the cut region 104 exposed via the protective film 140 may be, for example, in a range of about 5 μm to about 100 μm. However, the width 104 W is not limited thereto.

As semiconductor devices having a larger capacity and a higher integration degree are preferred, cut regions occupying a smaller area in a semiconductor substrate may be beneficial. A semiconductor substrate can be mechanically cut by a sawing blade. When mechanical cutting is performed, the risk of damage to the integrated circuit areas may be increased during a cutting process due to stress applied to the semiconductor substrate.

Accordingly, a process of cutting a semiconductor substrate by laser has been used. However, defects, such as peeling of an interlayer insulating film including a low-k dielectric material and an upper insulating film, may occur due to a random direction of propagation of cracks occurring in a modified layer of the semiconductor substrate.

In a method of manufacturing a semiconductor chip according to the inventive concept, the multilayer metal patterns 120 having a pyramid structure are provided in the cut regions 104 of the semiconductor substrate 100 to guide the crack CR (see FIG. 9B) to propagate to a central part of the multilayer metal patterns 120 (e.g., a central part of the multilayer metal patterns 120 in the first direction X), thereby allowing the interlayer insulating film 124 and the upper insulating film 134 to be cut in one direction. Thus, the interlayer insulating film 124 and the upper insulating film 134 may be suppressed from peeling off. Accordingly, defects of the semiconductor chip may be decreased and the electrical characteristics and production efficiency thereof may be improved.

A method of manufacturing a semiconductor chip 10 (see FIG. 10) by a cutting process of a semiconductor substrate 100 including multilayer metal patterns 120 in cut regions 104 will be described in detail below.

Figure 3:
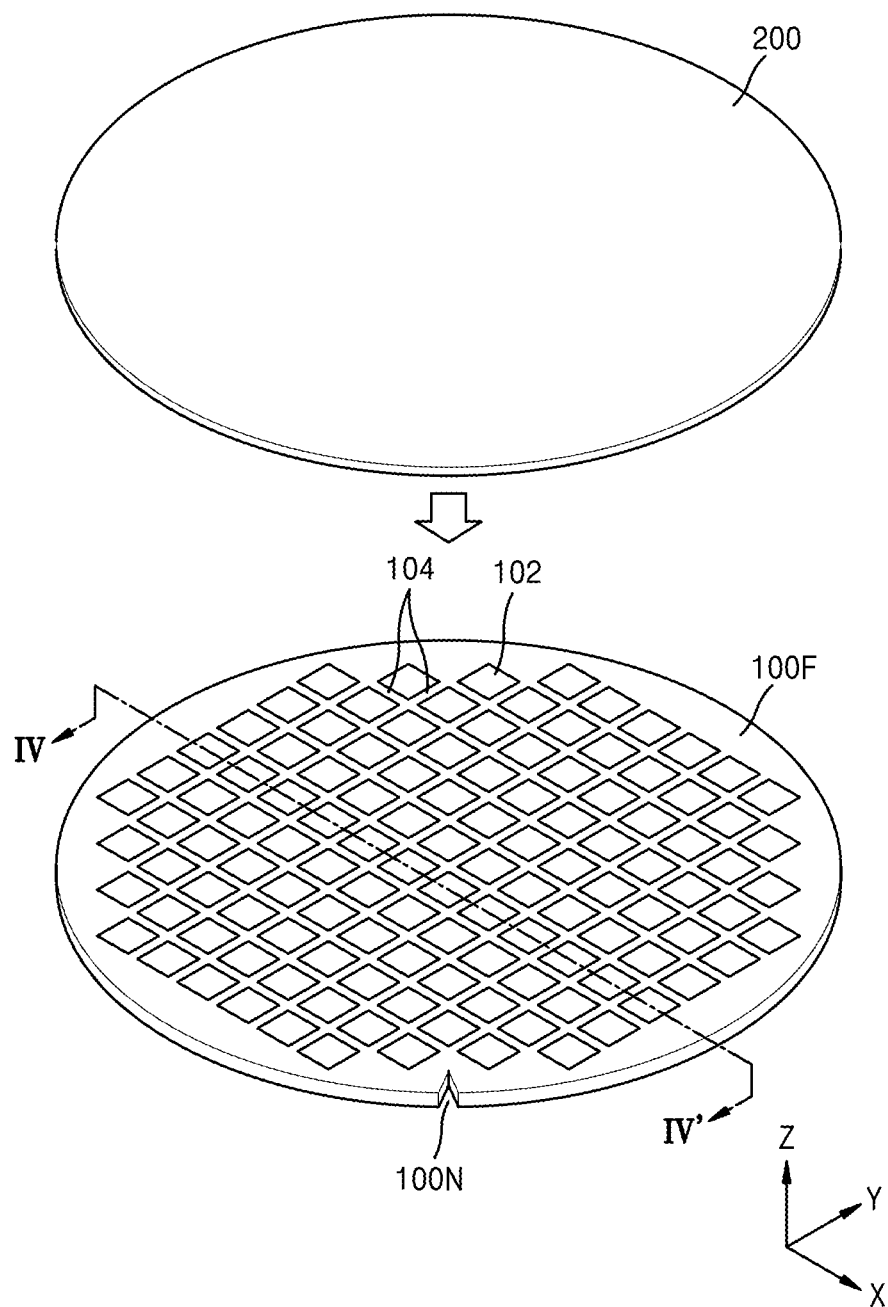
FIG. 3 is a perspective view illustrating an example in which a protective sheet is attached onto a semiconductor substrate according to some embodiments of the inventive concept.
Figure 4:
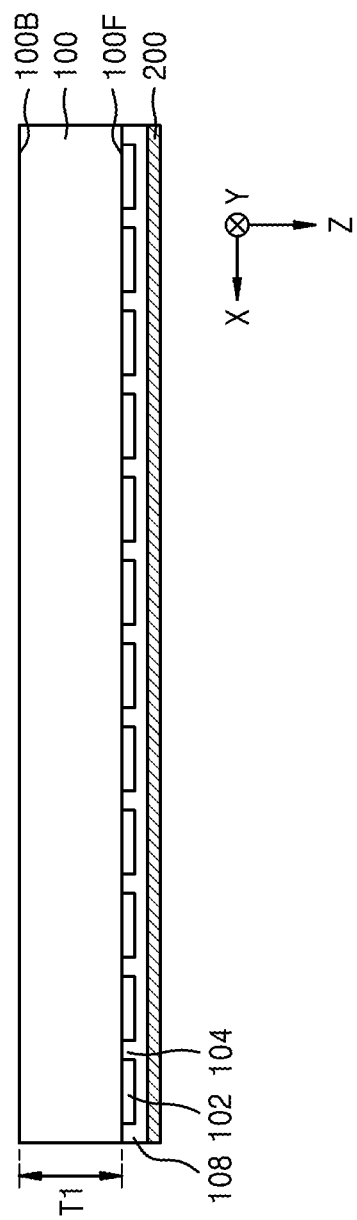
FIG. 4 is a cross-sectional view taken along the line IV-IV' of the semiconductor substrate having attached thereto the protective sheet of FIG. 3.

FIG. 3 is a perspective view illustrating an example in which a protective sheet is attached onto a semiconductor substrate according to some embodiments of the inventive concept. FIG. 4 is a cross-sectional view taken along line IV-IV' of the semiconductor substrate having attached thereto the protective sheet of FIG. 3.

Referring to FIGS. 3 and 4, a protective sheet 200 is attached onto an active surface 100F of the semiconductor substrate 100.

The protective sheet 200 may protect integrated circuit regions 102 during cutting of the semiconductor substrate 100.

The protective sheet 200 may be, for example, a polyvinylchloride (PVC)-based polymer sheet and may be attached onto the active surface 100F via an adhesive 108 (e.g., an acrylic resin adhesive). In some embodiments, the acrylic resin adhesive 108 may have a thickness of about 2 μm to about 10 μm, and the protective sheet 200 may have a thickness of about 60 μm to about 200 μm. The protective sheet 200 may have a round shape having a diameter that is substantially the same as that of the semiconductor substrate 100.

Figure 5:
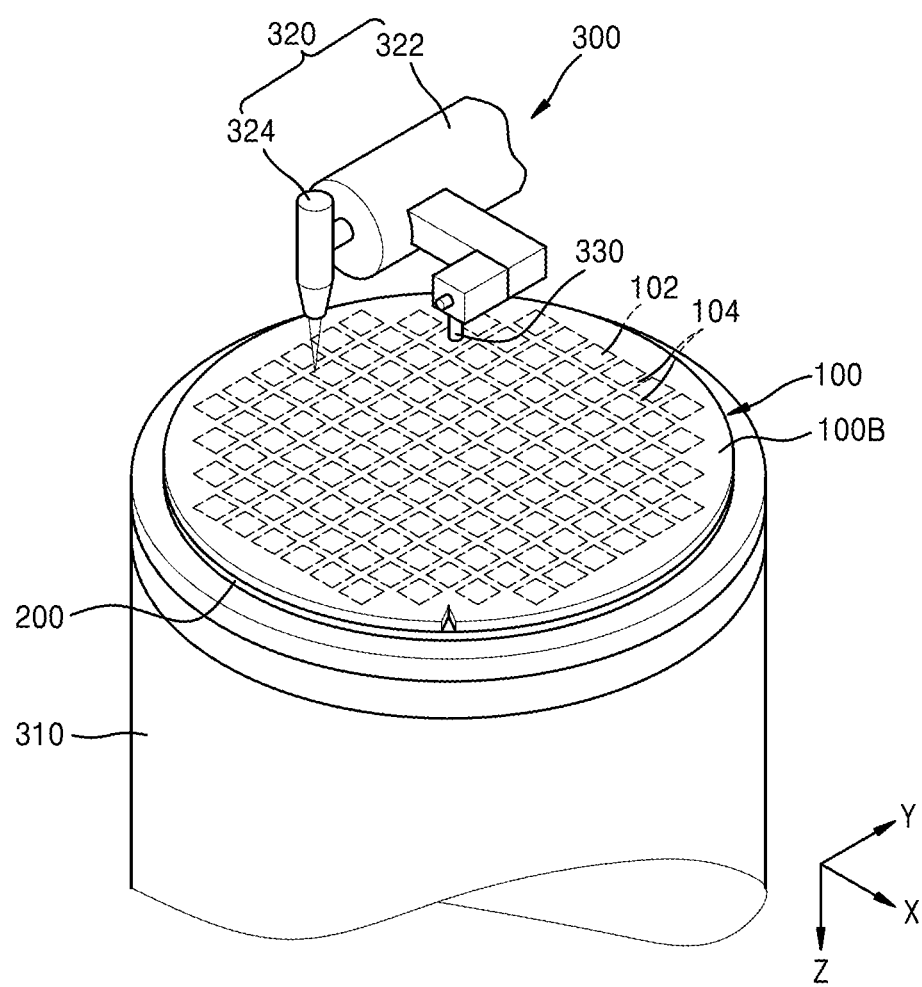
FIG. 5 is a perspective view illustrating an example in which a laser beam is emitted inside a semiconductor substrate according to some embodiments of the inventive concept.

FIG. 5 is a perspective view illustrating an example in which a laser beam is emitted the inside a semiconductor substrate 100 according to some embodiments of the inventive concept. Referring to FIG. 5, after the protective sheet 200 is attached onto the active surface 100F of the semiconductor substrate 100, a laser beam having a wavelength having transmittance with respect to the semiconductor substrate 100 may be controlled to form a light-converging point in the inside of the semiconductor substrate 100 and then be emitted along the cut regions 104.

When the laser beam is emitted inside the semiconductor substrate 100, a modified layer 150 (see FIG. 6) may be formed inside the semiconductor substrate 100 along the cut regions 104. The formation of the modified layer 150 may be performed by a laser emitting device 300.

The laser emitting device 300 may include a chuck table 310 for supporting the semiconductor substrate 100, a laser emitter 320 for emitting a laser beam to the semiconductor substrate 100 on the chuck table 310, and an image pickup unit 330 for capturing an image of a semiconductor substrate 100 on the chuck table 310. The chuck table 310 may be configured to suction and support the semiconductor substrate 100 by vacuum pressure and be movable in a first direction X and a second direction Y.

The laser emitter 320 may be configured such that a pulse laser beam is emitted from a condenser 324 mounted at a front end of a cylindrical housing 322 which is substantially horizontally arranged. The chuck table 310 and the condenser 324 may move relative to each other at an appropriate speed while a pulse laser beam having a wavelength having transmittance with respect to the semiconductor substrate 100 is emitted from the condenser 324.

The image pickup unit 330 mounted at another front end of the housing 322 of the laser emitter 320 may be a general charge-coupled device (CCD) imaging device that captures an image using visible light. In some embodiments, the image pickup unit 330 may include an infrared ray emitter which emits infrared rays to the semiconductor substrate 100, an optical system which captures the infrared rays emitted from the infrared ray emitter, and an infrared CCD image pickup device which outputs an electric signal corresponding to the infrared ray captured by the optical system.

The laser emitter 320 emits a laser beam after being aligned at a laser emission position. A light-converging point of the laser beam may be controlled to be positioned closer to the active surface 100F than the inactive surface 100B of the semiconductor substrate 100. That is, the modified layer 150 (see FIG. 5) may be located closer to the active surface 100F than to the inactive surface 100B of the semiconductor substrate 100.

Figure 6:
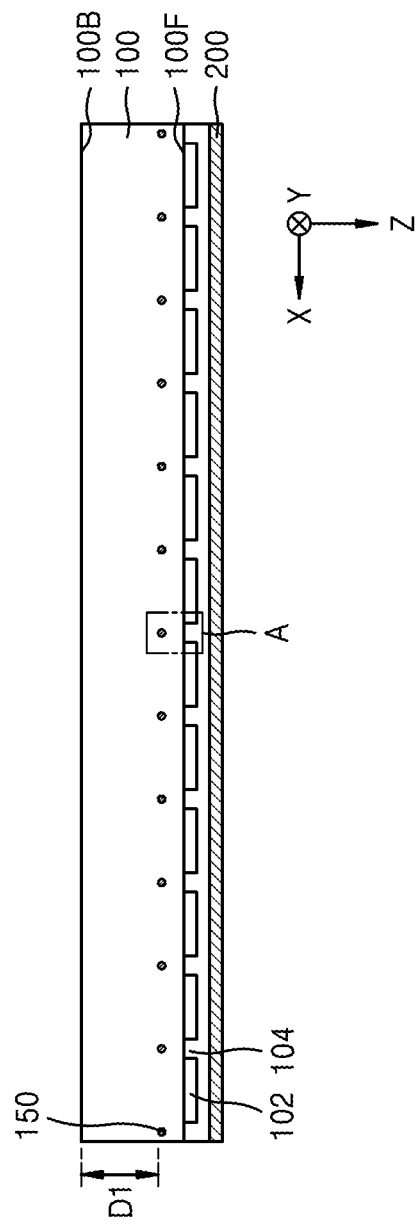
FIG. 6 is a cross-sectional view illustrating an example in which the emission of a laser beam onto a semiconductor substrate is completed, according to some embodiments of the inventive concept.
Figure 7A:
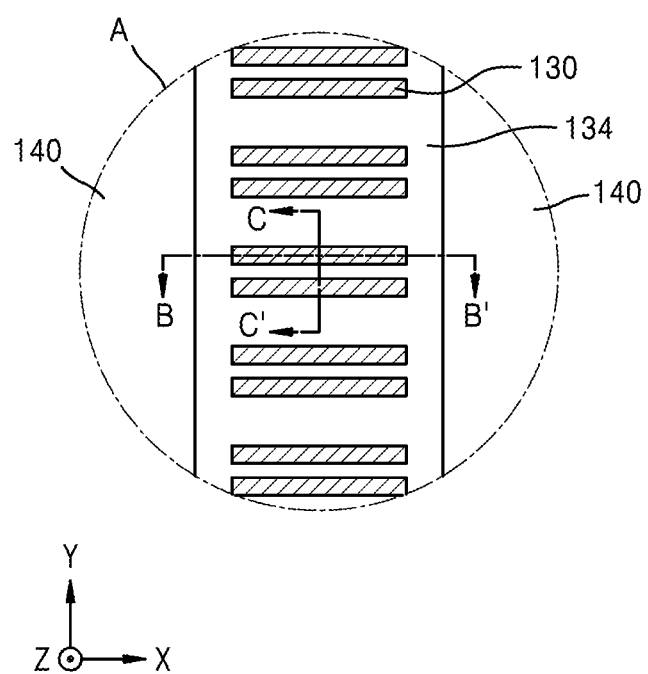
FIG. 7A is an enlarged plan view of the region A of FIG. 6 corresponding to that of FIG. 2A.
Figure 7B:
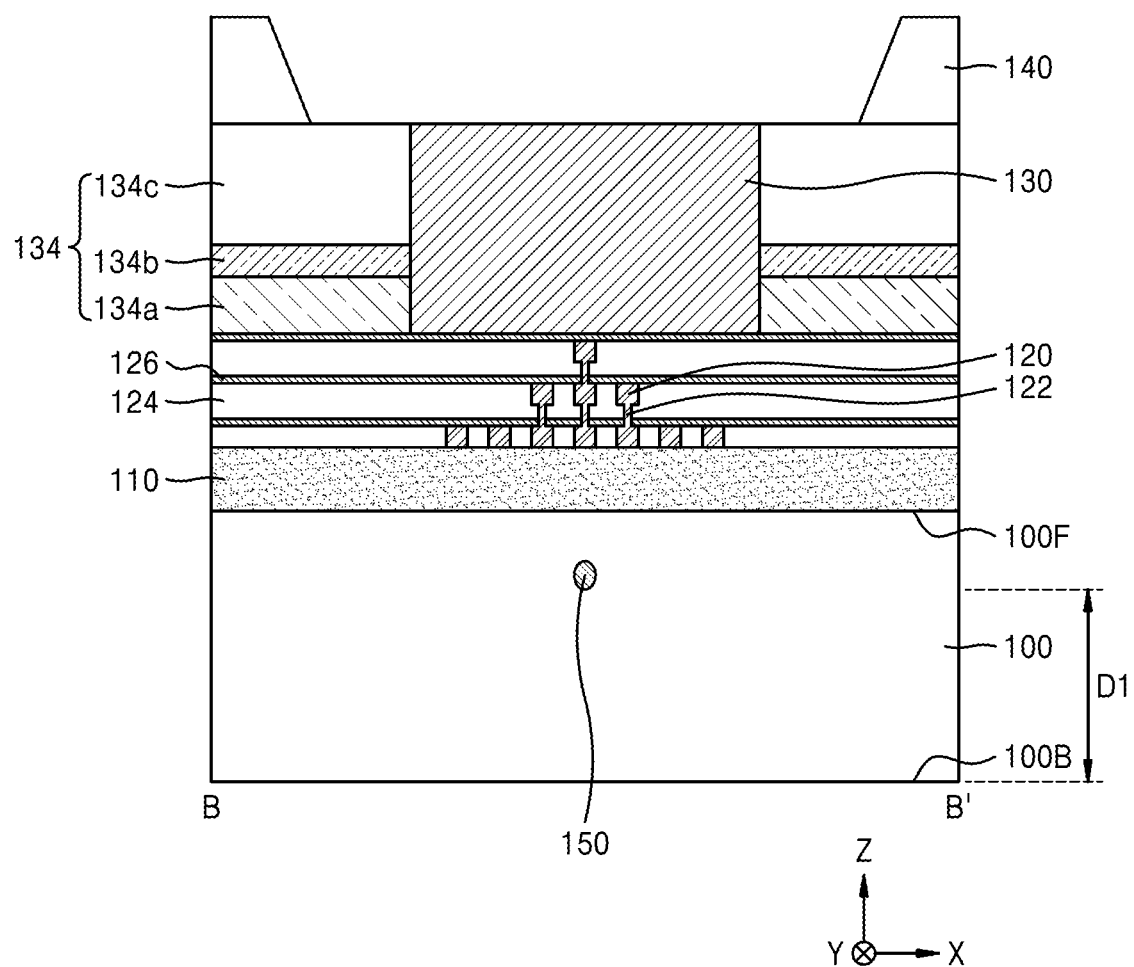
FIG. 7B is a cross-sectional view taken along the line B-B' of FIG. 7A.
Figure 7C:
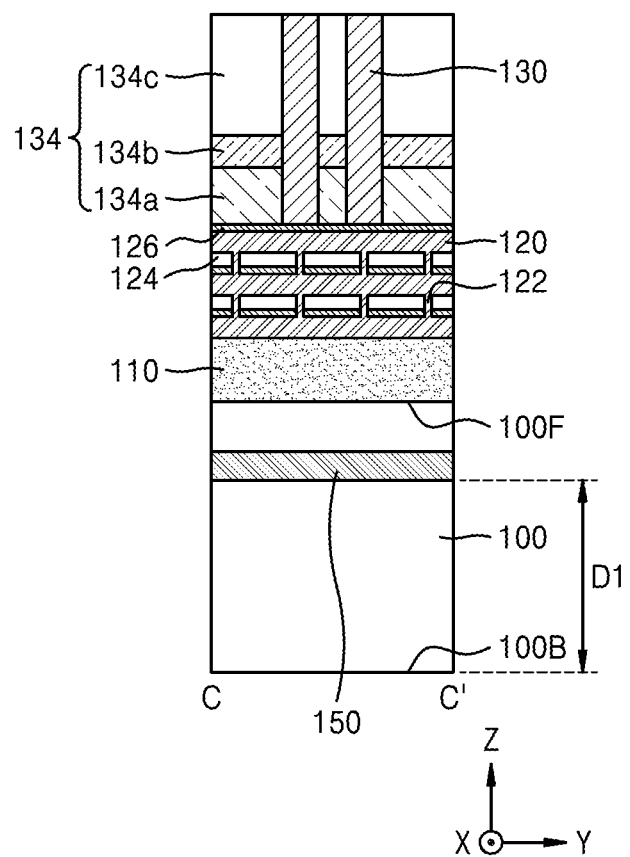
FIG. 7C is a cross-sectional view taken along the line C-C' of FIG. 7A.

FIG. 6 is a cross-sectional view illustrating an example in which the emission of a laser beam onto a semiconductor substrate is completed, according to some embodiments of the inventive concept. FIG. 7A is an enlarged plan view of the region A of FIG. 6 corresponding to that of FIG. 2A. FIG. 7B is a cross-sectional view taken along the line B-B' of FIG. 7A. FIG. 7C is a cross-sectional view taken along the line C-C' of FIG. 7A.

Referring to FIGS. 6 to 7C, the modified layer 150 may be spaced by a first distance D1 from the inactive surface 100B of the semiconductor substrate 100 and may be located closer to the active surface 100F than the inactive surface 100B. It will be understand that the first distance D1 is a shortest distance between the modified layer 150 and the inactive surface 100B of the semiconductor substrate 100 as illustrated in FIG. 7B.

Laser stands for light amplification by stimulated emission, and a light beam may be easily emitted to a desired position. The modified layer 150 may be formed at a desired position inside the semiconductor substrate 100 by using the characteristics of the laser. The modified layer 150 may include crack sites at which the crack CR (see FIG. 9B) may be generated due to external physical impacts.

The modified layer 150 may be located below the multilayer metal patterns 120. The modified layer 150 may be in the form of a straight lane having a certain width in the first direction X and extending in (e.g., extending longitudinally in) the second direction Y. That is, the long-axis direction of the multilayer metal patterns 120 and the direction in which the modified layer 150 extends may be the same. In some embodiments, the multilayer metal patterns 120 may overlap the modified layer 150, as illustrated in FIG. 7B.

Figure 8:
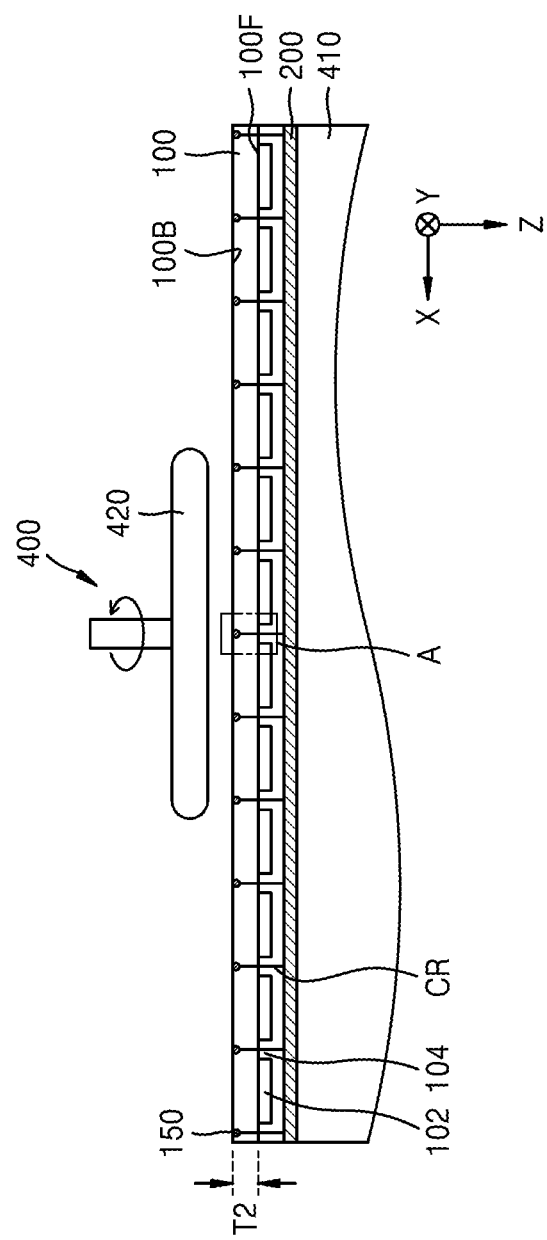
FIG. 8 is a cross-sectional view illustrating an example in which polishing is performed on a semiconductor substrate according to some embodiments of the inventive concept.
Figure 9A:
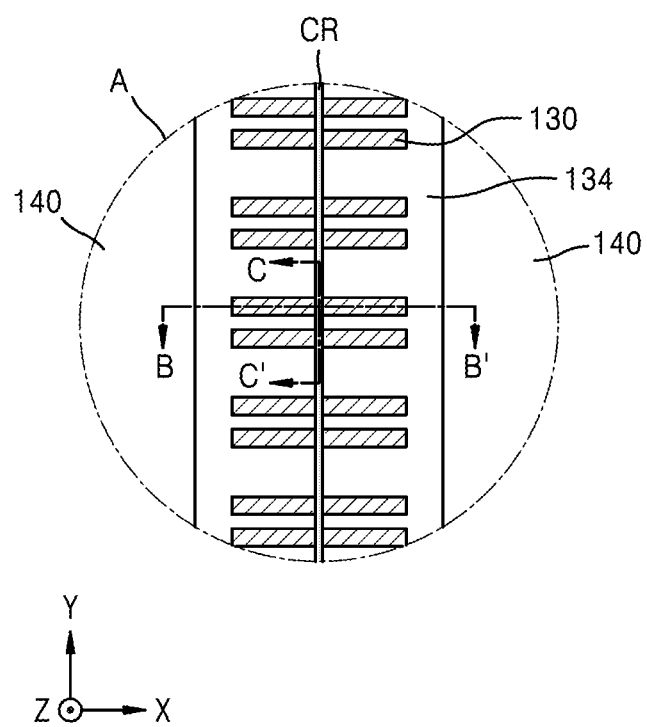
FIG. 9A is an enlarged plan view of the region A of FIG. 8 corresponding to that of FIG. 2A.
Figure 9B:
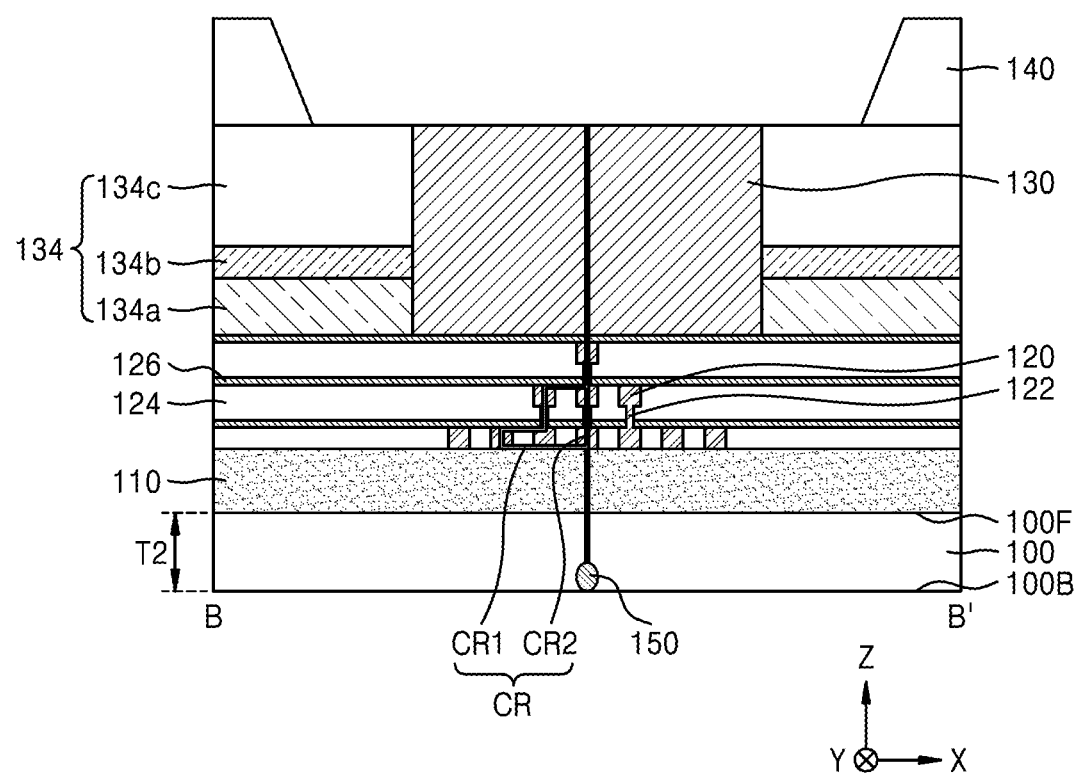
FIG. 9B is a cross-sectional view taken along the line B-B' of FIG. 9A.
Figure 9C:
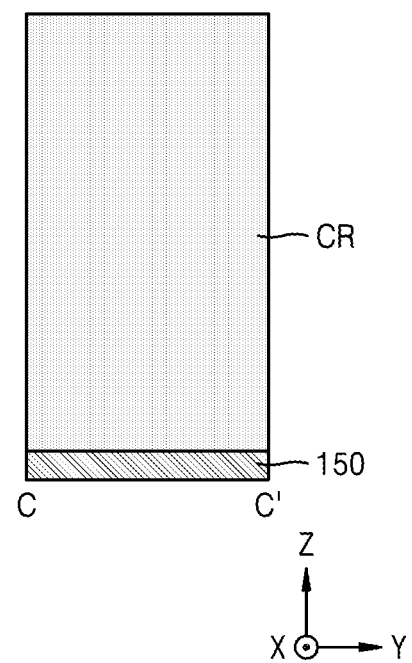
FIG. 9C is a cross-sectional view taken along the line C-C' of FIG. 9A.

FIG. 8 is a cross-sectional view illustrating an example in which polishing is performed on a semiconductor substrate 100 according to some embodiments of the inventive concept. FIG. 9A is an enlarged plan view of the region A of FIG. 8 corresponding to that of FIG. 2A. FIG. 9B is a cross-sectional view taken along the line B-B' of FIG. 9A. FIG. 9C is a cross-sectional view taken along the line C-C' of FIG. 9A.

Referring to FIGS. 8 to 9C, the inactive surface 100B of the semiconductor substrate 100 may be polished to form a crack CR in the cut region 104.

The inactive surface 100B of the semiconductor substrate 100 may be polished by a polishing device 400 to reduce the thickness of the semiconductor substrate 100 and propagate the crack CR from the modified layer 150.

The polishing device 400 may include a chuck table 410 for supporting the semiconductor substrate 100 and a grinder 420 for polishing the semiconductor substrate 100 on the chuck table 410. The grinder 420 may be moved while rotating, and a polishing pad may be attached onto the bottom of the grinder 420.

The polished semiconductor substrate 100 may have a thickness T2 which is substantially less than the initial first thickness T1 (see FIG. 2B). The second thickness T2 may be in a range of about 20 μm to about 50 μm.

The semiconductor substrate 100 may be polished to a final thickness by polishing the semiconductor substrate 100 by the polishing device 400. At the same time, in the cut region 104, the crack CR may propagate from the modified layer 150 in the third direction Z away from the active surface 100F of the polished semiconductor substrate 100.

According to the inventive concept, the inactive surface 100B of the semiconductor substrate 100 may be polished after the modified layer 150 is formed along the cut region 104 of the semiconductor substrate 100 by emitting a laser beam inside the semiconductor substrate 100. A process of polishing the semiconductor substrate 100 may be a grinding process performed while physical pressure is applied to the semiconductor substrate 100.

When the polishing process is performed while physical pressure is applied to the semiconductor substrate 100, the polished semiconductor substrate 100 may brittle fracture. Brittle fracture refers to the destruction of an object without being permanently deformed when a force greater than an elastic limit is applied to the object. Thus, the semiconductor substrate 100 which becomes gradually thinner during the polishing of the inactive surface 100B of the semiconductor substrate 100 may brittle fracture due to the crack CR propagating from the modified layer 150. The crack CR propagating from the modified layer 150 is generated along the cut region 104 isolating the integrated circuit regions 102 and thus the integrated circuit regions 102 may be divided into semiconductor chips 10 (see FIG. 10) due to the brittle fracture of the semiconductor substrate 100. The semiconductor chips 10 may be fixed by the protective sheet 200 not to be detached from the original position.

In some embodiments, the inactive surface 100B of the semiconductor substrate 100 may be further polished to remove the modified layer 150. Cut surfaces of the semiconductor chips 10 (see FIG. 10) obtained by completely removing the modified layer 150 may be smoother than those of the semiconductor chips 10 when mechanically cut by a sawing blade. Furthermore, all the crack sites inside the modified layer 150 may be removed when the modified layer 150 is completely removed during the polishing process, thereby reducing or possibly preventing the occurrence of other cracks CR.

The crack CR propagating from the modified layer 150 may be represented by, for example, a first crack CR1 or a second crack CR2. That is, the crack CR starting from the modified layer 150 passes through the semiconductor device layer 110, moves in the third direction Z, and then arrives at the multilayer metal patterns 120.

Since the multilayer metal patterns 120 are formed in a first layer to an $N^{th}$ layer on the active surface 100F (here, N represents an integer greater than or equal to 2), the crack CR may propagate to the $N^{th}$-layer metal pattern 120 from the first-layer metal pattern 120 in the third direction Z.

In some embodiments, even when some cracks, e.g., the first crack CR1, propagate in the first direction X or the second direction Y, the propagation of the cracks to the central part of the multilayer metal patterns 120 (e.g., the central part of the multilayer metal patterns 120 in the first direction X) may be induced due to the pyramid structure of the multilayer metal patterns 120. In some embodiments, the propagation of cracks, e.g., the second crack CR2, may be induced from the beginning in the form of a straight line along the central part of the multilayer metal patterns 120 in the third direction Z.

In other words, the multilayer metal patterns 120 may guide the cracks to propagate to the central part of the multilayer metal patterns 120, so that the interlayer insulating film 124 including the low-k dielectric material and the upper insulating film 134 may be cut in one direction by cutting a central part of the upper metal layer 130. Accordingly, the semiconductor substrate 100 may be cut without causing the interlayer insulating film 124 and the upper insulating film 134 to peel off.

Furthermore, widths into which the semiconductor substrate 100 is cut may be reduced by using laser. Accordingly, the widths of the cut regions 104 may be relatively reduced and thus more integrated circuit regions 102 may be formed in the semiconductor substrate 100, compared to a cutting process using a sawing blade.

Figure 10:
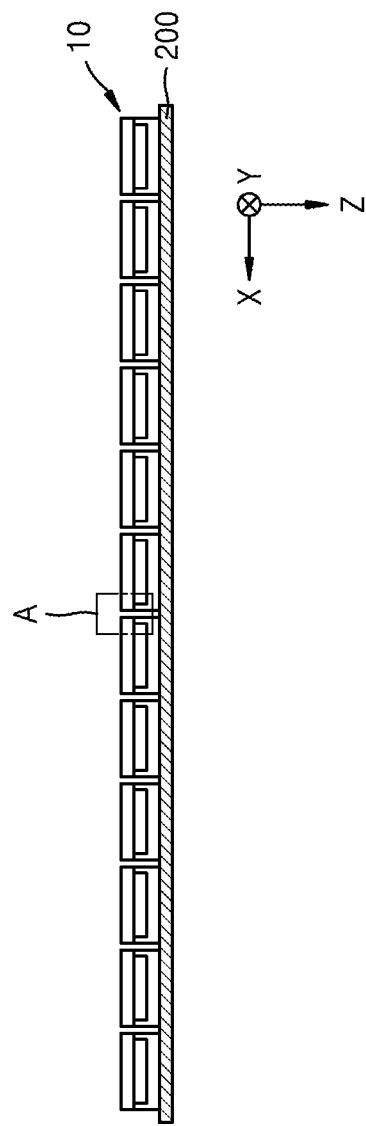
FIG. 10 is a cross-sectional view illustrating an example in which a semiconductor chips are separated from each other, according to some embodiments of the inventive concept.
Figure 11A:
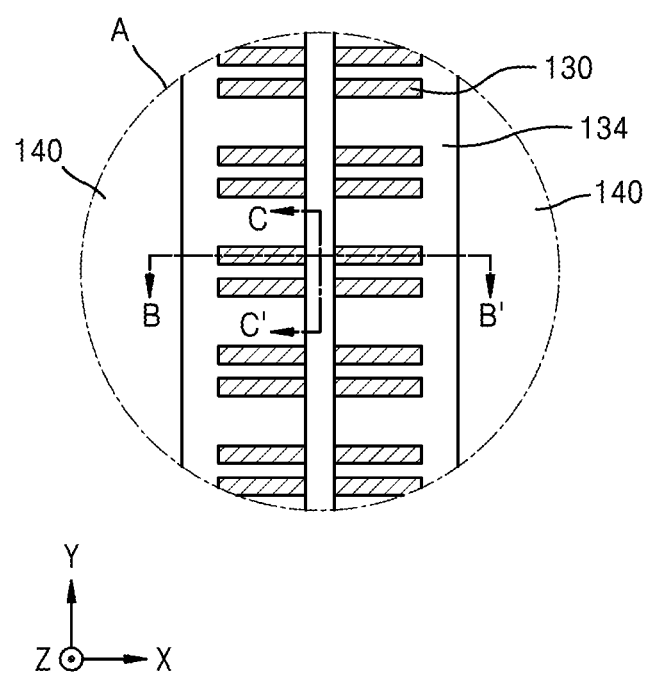
FIG. 11A is an enlarged plan view of the region A of FIG. 10 corresponding to that of FIG. 2A.
Figure 11B:
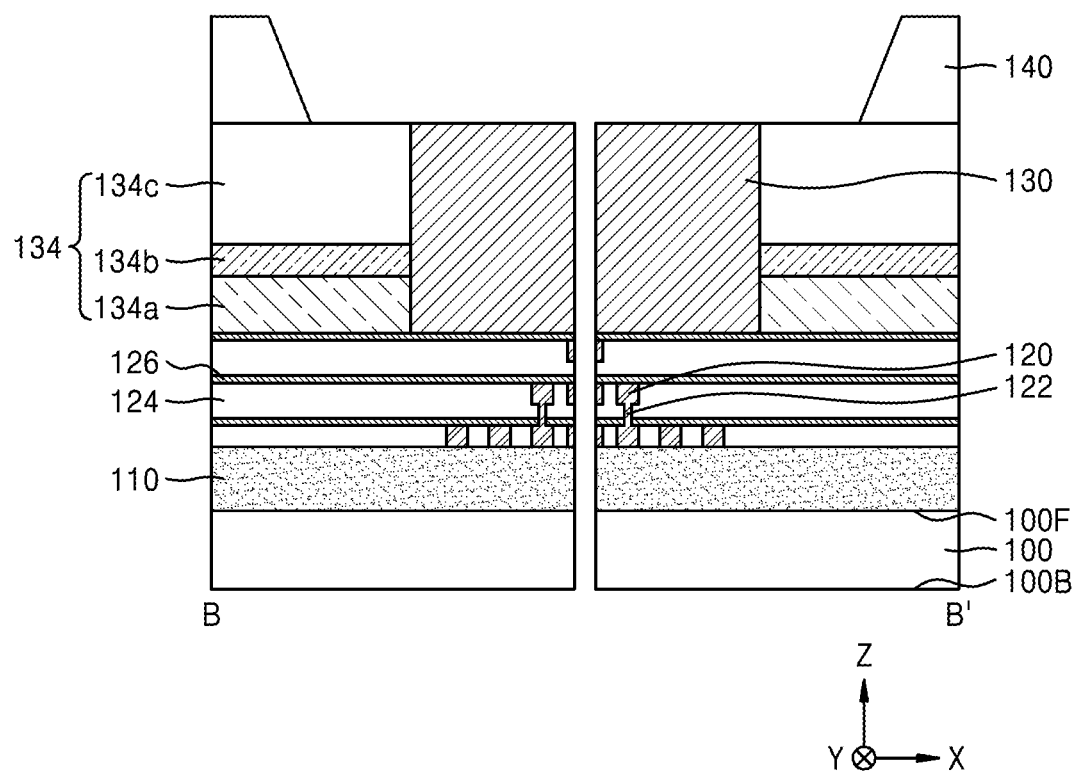
FIG. 11B is a cross-sectional view taken along the line B-B' of FIG. 11A.
Figure 11C:
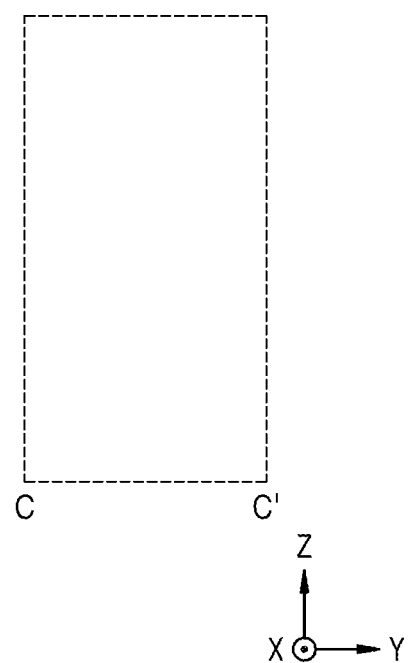
FIG. 11C is a cross-sectional view taken along the line C-C' of FIG. 11A.

FIG. 10 is a cross-sectional view illustrating an example in which semiconductor chips are separated from each other, according to some embodiments of the inventive concept. FIG. 11A is an enlarged plan view of the region A of FIG. 10 corresponding to that of FIG. 2A. FIG. 11B is a cross-sectional view taken along the line B-B' of FIG. 11A. FIG. 11C is a cross-sectional view taken along the line C-C' of FIG. 11A.

Referring to FIGS. 10 to 11C, a semiconductor substrate 100 is divided into semiconductor chips 10 by a cutting process.

Here, a case in which a cut surface is formed by inducing the propagation of cracks, e.g., the second crack CR2 (see FIG. 9B), in the form of a straight line along a central part of multilayer metal patterns 120 in a third direction Z from the beginning will be described.

In detail, integrated circuit regions 102 of the semiconductor substrate 100 may be divided into semiconductor chips 10 by using cracks CR in the cut regions 104 (see FIG. 9B). The semiconductor chips 10 may not be moved from the original position by the protective sheet 200.

In a method of manufacturing a semiconductor chip according to some embodiments of the inventive concept, the multilayer metal patterns 120 having a pyramid structure are formed in the cut regions 104 of the semiconductor substrate 100 to induce the propagation of the cracks CR (see FIG. 9B) to the central part of the multilayer metal patterns 120, and thus an interlayer insulating film 124 including a low-k dielectric material and an upper insulating film 134 may be cut in one direction (i.e., a desired direction). Thus, the semiconductor chips 10 in which the interlayer insulating film 124 and the upper insulating film 134 may not be peeled off. Accordingly, defects of the semiconductor chips 10 may be reduced and the electrical characteristics and efficiency of production of the semiconductor chips 10 may be improved.

Figure 12:
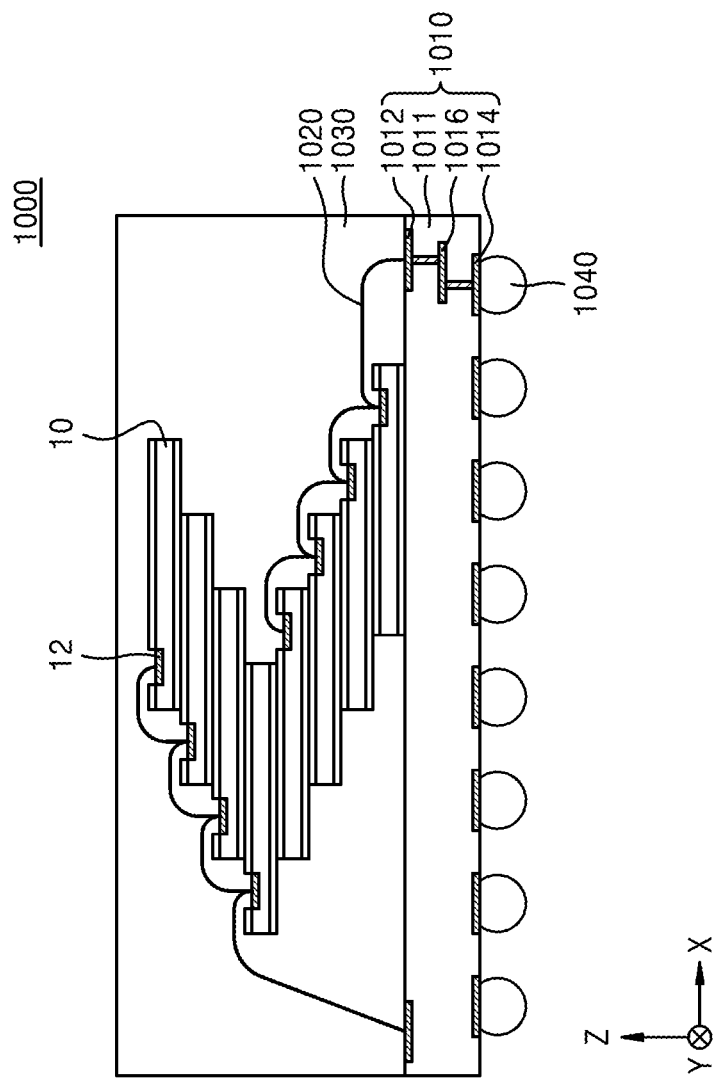
FIG. 12 is a cross-sectional view illustrating a structure of a semiconductor package including semiconductor chips manufactured by a semiconductor chip manufacturing method according to some embodiments of the inventive concept.

FIG. 12 is a cross-sectional view illustrating a structure of a semiconductor package including semiconductor chips manufactured by a semiconductor chip manufacturing method according to some embodiments of the inventive concept.

Referring to FIG. 12, a semiconductor package 1000 may include a package substrate 1010, a plurality of semiconductor chips 10, a connection member 1020, and a molding member 1030.

The package substrate 1010 is a support substrate and may include a body part 1011, a lower protective layer, and an upper protective layer. The package substrate 1010 may be formed based on a printed circuit board (PCB), a wafer board, a ceramic board, a glass board, an interposer board, or the like. In some embodiments of the inventive concept, the package substrate 1010 may be a PCB. However, the package substrate 1010 is not limited to a PCB.

In the package substrate 1010, a wiring 1016 may be formed and electrically connected to the semiconductor chips 10 via the connection member 1020 connected to an upper electrode pad 1012 on a top surface of the package substrate 1010. An external connection terminal 1040 may be provided on a lower electrode pad 1014 on a bottom surface of the package substrate 1010. The package substrate 1010 may be mounted on a module substrate or a system board of an electronic product or the like to be electrically connected thereto via the external connection terminal 1040.

In the body part 1011, the wiring 1016 may be formed in multiple layers or a single layer, and the external connection terminal 1040 and the semiconductor chips 10 may be electrically connected via the wiring 1016. The lower protective layer and the upper protective layer protect the body part 1011 and may be formed, for example, by solder resist.

Generally, when the package substrate 1010 is a PCB, the body part 1011 may be formed by forming a thin film by compressing a polymer material such as a thermosetting resin, an epoxy-based resin such as FR-4 (flame retardant 4), bismaleimide triazine (BT), Ajinomoto build-up film (ABF), or a phenolic resin to a certain thickness, coating both surfaces of the thin film with copper foil, and patterning the thin film to form the wiring 1016 serving as an electrical signal transmission path. The lower protective layer and the upper protective layer may be formed by applying solder resist completely onto upper and lower surfaces of the body part 1011, except portions of the body part 1011 to be connected to the external connection terminal 1040, e.g., the upper electrode pad 1012 and the lower electrode pad 1014.

The PCB may be classified into a single-layer PCB having the wiring 1016 on only one surface thereof and a double-layer PCB having the wiring 1016 on both surfaces thereof. In some embodiments, a multilayer PCB may be formed by forming three or more copper foil layers using prepreg, which is an insulator, and forming three or more wirings 1016 according to the number of copper foil layers. However, the package substrate 1010 is not limited to the structure and a material of the above-described PCB and may be formed of various materials.

The semiconductor chips 10 may be electrically connected to the package substrate 1010 via the connection member 1020. The connection member 1020 may electrically connect the package substrate 1010 to the semiconductor chips 10 by electrically connecting the upper electrode pad 1012 of the package substrate 1010 to a connection pad 12 of the semiconductor chip 10. In some embodiments, the connection member 1020 may be a bonding wire.

The connection member 1020 may be used to electrically connect the semiconductor chips 10 to the package substrate 1010. Via the connection member 1020, at least one of a control signal, a power signal, and a ground signal for operating the semiconductor chips 10 may be received, a data signal to be stored in the semiconductor chips 10 may be received, or data stored in the semiconductor chips 10 may be transmitted.

The molding member 1030 may surround the semiconductor chips 10 and may protect the semiconductor chips 10 from an external environment. In some embodiments, the molding member 1030 may be formed by injecting an appropriate amount of molding resin onto the package substrate 1010 by an injection process and performing a curing process thereon and may form the exterior of the semiconductor package 1000. The exterior of the semiconductor package 1000 may be formed by applying pressure to the molding resin in a pressure process such as a press process, if necessary. Here, process conditions, such as a delay time between the injection of the molding resin and the applying of the pressure to the molding resin, the amount of the molding resin to be injected, and pressing temperature/pressure, may be set considering physical properties such as the viscosity of the molding resin.

Side surfaces and an upper surface of the molding member 1030 may form right angles. Generally, the side surfaces and the upper surface of the molding member 1030 may form right angles during a process of cutting the package substrate 1010 along dicing lines into package substrates 1010. Although not shown, a marking pattern containing information regarding the semiconductor chips 10, e.g., barcode, numbers, characters, symbols, etc., may be formed on part of the side surfaces of the semiconductor package 1000.

In some embodiments, the molding resin may include an epoxy-group molding resin or a polyimide-group molding resin. The molding member 1030 may be formed of, for example, an epoxy molding compound (EMC).

The connection pad 12 may be provided on a semiconductor device layer and may be electrically connected to an interconnection layer in the semiconductor device layer. The interconnection layer may be electrically connected to the connection member 1020 via the connection pad 12. The connection pad 12 may include, for example, at least one of aluminum (Al), copper (Cu), nickel (Ni), tungsten (W), platinum (Pt), and gold (Au).

A passivation layer may be formed on the semiconductor device layer to protect the semiconductor device layer, the interconnection layer, and the other structures from external impacts or moisture. The passivation layer may expose at least a portion of the top surface of the connection pad 12.

The semiconductor chips 10 of the semiconductor package 1000 may have a stack structure. When eight semiconductor chips 10 are stacked as illustrated in the drawings, the eight semiconductor chips 10 may be divided into two groups each including four semiconductor chips 10, and the semiconductor package 1000 may include two groups each including four semiconductor chips 10.

In order to sequentially stack the four semiconductor chips 10 of the first group in an up direction, the semiconductor chips 10 may be arranged by being sequentially moved in the first direction X such that the connection pads on the semiconductor chip 10 are exposed.

The four semiconductor chips 10 of the second group may be stacked on the first group. The four semiconductor chips 10 of the second group may be arranged by being sequentially moved in a direction opposite to the first direction X in which the four semiconductor chips 10 of the first group are moved.

The semiconductor chips 10 of the semiconductor package 1000 may be manufactured by a method of manufacturing a semiconductor chip according to the inventive concept. Accordingly, the semiconductor chips 10 may be possibly prevented from peeling off, thereby making cut surfaces thereof smooth.

Figure 13:
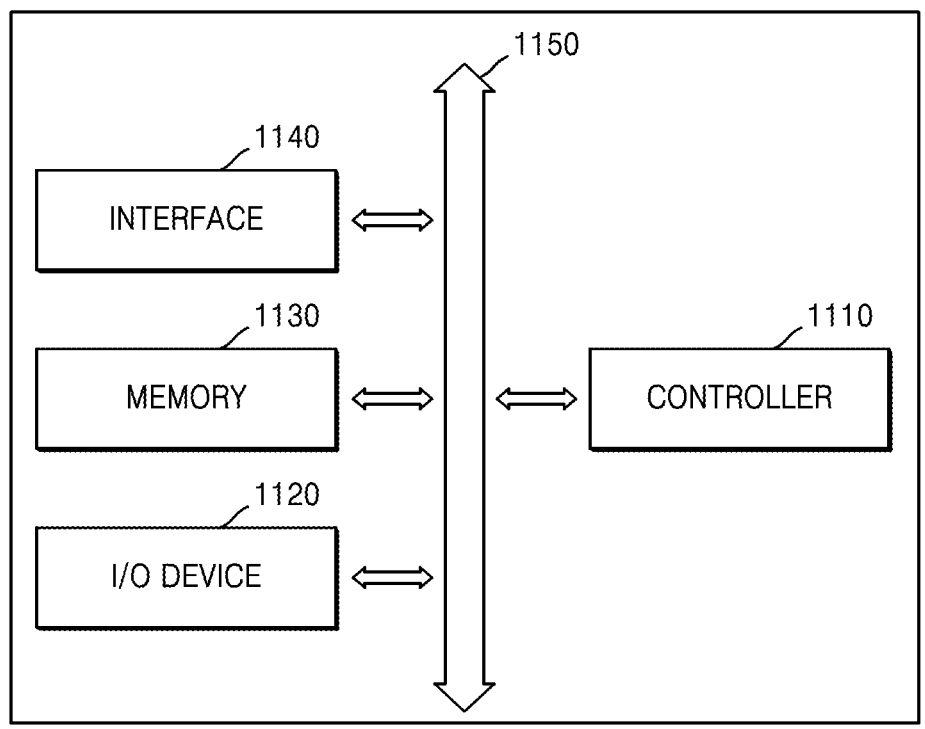
FIG. 13 is a block diagram of a system of a semiconductor package including semiconductor chips manufactured by a semiconductor chip manufacturing method according to some embodiments of the inventive concept.

FIG. 13 is a block diagram of a system of a semiconductor package including semiconductor chips manufactured by a semiconductor chip manufacturing method according to some embodiments of the inventive concept.

Referring to FIG. 13, a system 1100 includes a controller 1110, an input/output (I/O) device 1120, a memory 1130, an interface 1140, and a bus 1150.

The system 1100 may be a mobile system or a system which transmits or receives information. In some embodiments, the mobile system may be a portable computer, a web tablet PC, a mobile phone, a digital music player, or a memory card.

The controller 1110 is configured to control a program that is run in the system 1100 and may include a microprocessor, a digital signal processor, a microcontroller, or the like.

The I/O device 1120 may be used to input data to or output from the system 1100. The system 1100 may be connected to an external device, e.g., a personal computer or a network, via the I/O device 1120, and may exchange data with the external device. The I/O device 1120 may be, for example, a touch pad, a keyboard, or a display.

The memory 1130 may store data for operating the controller 1110 or data processed by the controller 1110. The memory 1130 may be manufactured by a method of manufacturing a semiconductor chip according to the inventive concept.

The interface 1140 may be a data transmission path between the system 1100 and an external device. The controller 1110, the I/O device 1120, the memory 1130, and the interface 1140 may communicate with each other via the bus 1150.

While some example embodiments of the inventive concept have been described with reference to accompanying drawings, it will be understood that the inventive concept may be embodied in many different forms without departing from the scope or essential features thereof. Accordingly, the above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor chip comprising:
    a semiconductor substrate comprising an integrated circuit region and a cut region for separating the integrated circuit region;
    a plurality of multilayer metal patterns in the cut region, the plurality of multilayer metal patterns comprising a first metal pattern at a first level, a second metal pattern at a second level, and a vertical via connecting the first metal pattern to the second metal pattern; and
    an interlayer insulating film comprising a first insulating film layer at the first level, a second insulating film layer at the second level, and a material film between the first insulating film layer and the second insulating film layer,
    wherein the material film comprises a material different from the first insulating film and the second insulating film,
    a number of the plurality of multilayer metal patterns at the second level is less than a number of the plurality of multilayer metal patterns at the first level, and
    an upper surface of the first metal pattern at the first level contacts the vertical via and is spaced apart from upper surfaces of remaining ones of the plurality of multilayer metal patterns at the first level.

2. The semiconductor chip of claim 1, wherein the plurality of multilayer metal patterns are arranged on the semiconductor substrate from the first level to an Nth level, and N is a natural number greater than or equal to 2, and
    wherein the plurality of multilayer metal patterns are symmetric with respect to a central portion of the plurality of multilayer metal patterns in a direction parallel to a top surface of the semiconductor substrate.

3. The semiconductor chip of claim 1, wherein the first insulating film layer and the second insulating film layer each comprise a low-k dielectric material.

4. The semiconductor chip of claim 1, wherein the plurality of multilayer metal patterns are configured to induce a direction in which a cross section of the semiconductor chip is formed to an apex of a triangle structure, and
    wherein the second metal pattern is spaced apart in a direction parallel to a top surface of the semiconductor substrate from outermost ones of the plurality of multilayer metal patterns in the direction.

5. The semiconductor chip of claim 4, wherein the cross section is configured to cause brittle fracture on the semiconductor substrate.

6. The semiconductor chip of claim 5, wherein the cross section is formed continuously from a lowermost level of the plurality of multilayer metal patterns to an uppermost level of the plurality of multilayer metal patterns.

7. The semiconductor chip of claim 1, further comprising an upper metal layer, on the plurality of multilayer metal patterns, which has a longest dimension in a direction that is perpendicular to a direction in which the plurality of multilayer metal patterns have a longest dimension.

8. The semiconductor chip of claim 1, further comprising a protection film exposing an upper portion of the cut region and covering an upper portion of the integrated circuit region.

9. The semiconductor chip of claim 8, wherein a width of the cut region exposed by the protection film is about 5 µm to about 100 µm.

10. The semiconductor chip of claim 8, wherein a side wall of the protection film is an inclined surface.

11. A semiconductor chip comprising:
    an integrated circuit region and a cut region;
    a plurality of multilayer metal patterns in the cut region;
    an upper metal layer on the plurality of multilayer metal patterns; and
    a vertical via connecting a first one of the plurality of multilayer metal patterns at a first distance from the upper metal layer to a second one of the plurality of multilayer metal patterns at a second distance from the upper metal layer,
    wherein a number of the plurality of multilayer metal patterns per unit area increases as a distance from the upper metal layer increases,
    a cross section is formed at a central portion of at least one of the plurality of multilayer metal patterns, and
    an upper surface of the first one of the plurality of multilayer metal patterns contacts the vertical via and is spaced apart from upper surfaces of remaining ones of the plurality of multilayer metal patterns at the first distance from the upper metal layer.

12. The semiconductor chip of claim 11, further comprising a protection film exposing an upper portion of the cut region and covering an upper portion of the integrated circuit region.

13. The semiconductor chip of claim 12, wherein a width of the cut region exposed by the protection film is about 5 µm to about 100 µm.

14. The semiconductor chip of claim 11, wherein a longest dimension of the plurality of multilayer metal patterns is perpendicular to a longest dimension of the upper metal layer.

15. The semiconductor chip of claim 11, further comprising:
    a low-k dielectric material surrounding the plurality of multilayer metal patterns; and
    a silicon oxide and a silicon nitride surrounding the upper metal layer.

16. A semiconductor chip comprising:
    a semiconductor substrate comprising an active surface and an inactive surface opposite to each other;
    an integrated circuit region on the active surface, the integrated circuit region being sectioned by a cut region;
    metal patterns of N levels on the cut region, wherein N is an natural number greater than or equal to 2;
    a vertical via connecting one of the metal patterns at a (K−1)th level to one of the metal patterns at a Kth level; and
    a low-k dielectric material film surrounding the metal patterns,
    wherein upper surfaces of the metal patterns at respective levels are spaced apart from each other,
    a number of the metal patterns per unit area at the Kth level is less than a number of the metal patterns per unit area at the (K−1)th level, and K is a natural number between 2 to N, and
    an upper surface of the one of the metal patterns at the (K−1)th level contacts the vertical via.

17. The semiconductor chip of claim 16, wherein a cross section of the semiconductor chip is formed as a single cross section from a first level to an Nth level of the metal patterns, and
    wherein the metal patterns are symmetric with respect to an axis that extends in a direction perpendicular to a top surface of the semiconductor substrate.

18. The semiconductor chip of claim 17, wherein the cross section cuts the low-k dielectric material film in the single cross section.

19. The semiconductor chip of claim 16, wherein the vertical via contacts a lower surface of the one of the metal patterns at the Kth level.

20. The semiconductor chip of claim 19, wherein the two of the metal patterns and the vertical via are dummy structures.

* * * * *